United States Patent [19]
Takami et al.

[11] Patent Number: 4,789,777
[45] Date of Patent: Dec. 6, 1988

[54] PHOTELECTRIC AMPLIFIER HAVING PLURAL ACTUABLE FEEDBACK PATHS

[75] Inventors: Satoshi Takami; Yutaka Ohsawa, both of Tokyo, Japan

[73] Assignee: Asahi Kogaku Kogyo Kabushiki Kaisha, Tokyo, Japan

[21] Appl. No.: 65,753

[22] Filed: Jun. 24, 1987

[30] Foreign Application Priority Data

Jun. 24, 1986 [JP] Japan .................. 61-146075

[51] Int. Cl.$^4$ ........................................ H01J 40/14
[52] U.S. Cl. ................... 250/214 A; 330/59
[58] Field of Search .......... 250/214 A, 214 AG, 569; 356/213, 224; 330/282, 59; 354/4

[56] References Cited

U.S. PATENT DOCUMENTS

| | | | |
|---|---|---|---|
| 4,216,434 | 8/1980 | Wermuth | 330/282 |
| 4,426,624 | 1/1984 | Beauducel et al. | 330/282 |
| 4,439,739 | 3/1984 | Kilian et al. | 330/282 |
| 4,459,475 | 7/1984 | Flint et al. | 250/214 A |
| 4,508,686 | 1/1985 | Shaber et al. | 250/569 |
| 4,626,677 | 12/1986 | Browne | 250/214 A |
| 4,673,807 | 6/1987 | Kobayashi et al. | 250/214 AG |

Primary Examiner—David C. Nelms
Assistant Examiner—William L. Oen
Attorney, Agent, or Firm—Sughrue, Mion, Zinn, Macpeak, and Seas

[57] ABSTRACT

A photoelectric amplifier in a camera exposure system, in which a photodiode is connected across the inputs of an operational amplifier and charges an integrating circuit in a feedback path across the operational amplifier. The resistance of the feedback path can be varied in response to the film sensitivity. The output of the operational amplifier is compared against a films speed reference voltage. Thereby, a reduced range of film speed reference voltages need to be provided because of the optional gain of the photovoltage.

5 Claims, 2 Drawing Sheets

PHOTELECTRIC AMPLIFIER HAVING PLURAL ACTUABLE FEEDBACK PATHS

BACKGROUND OF THE INVENTION

1. Field of the Invention

This invention relates to a photometric amplifier for the photometric circuit of cameras in which a photodiode is employed as a light receiving element.

2. Background of the Invention

A camera has a photometric circuit for converting the luminance of an object into electrical data. In general, the photometric circuit is a so-called "photometric amplifier" which is made up of a light receiving unit such as a photoelectric coversion element or photovoltaic element and an amplifier for photoelectric conversion data.

FIG. 1 is a circuit diagram showing one example of a conventional photometric amplifier. The photometric amplifier includes an integrating circuit formed by connecting a capacitor 2 between the inverting input terminal and the output terminal of an operational amplifier 1. A photovoltaic element, namely, a photodiode 3 is connected between the inverting input terminal and the non-inverting input terminal of the operational amplifier 1.

In the photometric amplifier, the photodiode 3 receives light from an object and subjects it to photoelectric conversion to output a photocurrent i and the photocurrent i is charged in the capacitor 2. As a result, an input voltage $v_i$ at the inverting input terminal increases in the positive direction with respect to a reference voltage $V_{ref}$ at the non-inverting input terminal. As a result, an inverted output voltage $V_o$, according to the differential input voltage, is output as photometric data.

The photometric data is operated upon with exposure factors such as an aperture value and a film sensitivity to obtain shutter time data. However, in general, the photometric data is processed as logarithmically converted compressed data in order to cover a wide range of object luminacents.

A camera having a first photometric amplifier for measuring the brightness of an object under natural light and a second photometric amplifier for measuring the brightness of an object illuminated by an artifical light source from an illuminating unit such as a flash light has been proposed in the art. In this camera, it is unnecessary to subject the output photometric data of the second photometric amplifier to logarithmic. compression. Therefore, the photometric data is operated upon with an exposure factor or a film sensitivity ISO.

What is shown in FIG. 1 is one example of the second photometric amplifier in which the photometric data and film sensitivity data $V_S$ are subjected to comparision in a comparator 4, which provides an output $V_x$ such as shutter time data.

An electronic shutter camera using a microcomputer has been developed. In the camera, a film sensitivity ISO is stored as digital data in memory. The digital data corresponding to the film sensitivity thus set is applied to a D/A (digital-to-analog) converter, so that it is output as the film reference voltage $V_S$ of the above-described comparator 4.

In the above-described photometric amplifier, the output voltage $V_o$ is compared, as it is, to a film reference voltage $V_S$ corresponding to the ISO film sensitivity. Therefore, the film resolution of the film reference voltage $V_S$ introduces difficulties.

The following Table 1 shows resolution examples of the reference voltage $V_S$ mentioned above:

TABLE 1

| ($V_s$: millivolts (mV)) | | |
| --- | --- | --- |
| $V_s$ Resolution Example 1 | $V_s$ Resolution Example 2 | ISO |
| 40 | 320 | 50 |
| 20 | 160 | 100 |
| 10 | 80 | 200 |
| 5 | 40 | 400 |
| 2.5 | 20 | 800 |
| 1.25 | 10 | 1600 |

In resolution example 1, the maximum voltage 40 mV is a reference value. As the ISO value increases, the voltage is decreased, for instance, to 1.25 mV. It is rather difficult to form memory means for digital data providing such a small voltage value.

In resolution example 2, the minimum voltage 10 mV is a reference value. As the ISO value decreases, a high voltage such as for instance 320 mV is required. Such a high voltage is not suitable for the operation of digital memory means because the voltage value which can be handled by the digital memory means is limited.

SUMMARY OF THE INVENTION

In view of the foregoing, an object of this invention is to provide a photometric amplifier in which reference voltages necessary for setting an exposure factor such as for instance a film sensitivity ISO can be decreased in number and in range, and an offset voltage can be effectively eliminated.

The object of the invention has been achieved by the provision of a gain switching device for a photometric amplifier comprising a feedback amplifier which receives the output of a photodiode and outputs, as photometric data, the integration value of an integrating capacitor according to the photocurrent.

A further object of the present invention is to provide a photoelectric amplifier capable of eliminating an undesired problem caused by an offset voltage of an operational amplifier contained therein. This problem is significant in the use of an operational amplifier incorporating FETs.

According to a first aspect of the invention, the gain switching device comprises circuit connecting means for connecting the integrating capacitor directly or through a gain switching resistor to the output terminal of the feedback amplifier and a feedback resistor for feeding back the integration voltage of the integrating capacitor.

Furthermore, the gain switching device has been provided for a photometric amplifier comprising an inversion amplifier with a photodiode connected between its two input terminals in which an integrating capacitor is charged by the photocurrent. According to a second aspect of the invention, the gain switching device comprises first circuit connecting means for connecting the integrating capacitor directly to the output terminal of the inversion amplifier, second circuit connecting means for connecting the integrating capacitor through a gain resistor to the output terminal of the inversion amplifier, a feedback resistor for feeding back the integration voltage of the integrating capacitor, and third circuit connecting means which, with the first and second circuit connection means held open, provides as an inversion amplifier output an integration voltage based on an input offset voltage stored in the integrating capacitor.

DETAILED DESCRIPTION OF THE PREFERRED EMBODIMENTS

One embodiment of this invention will be described with reference to the accompanying drawings.

Figure 2:
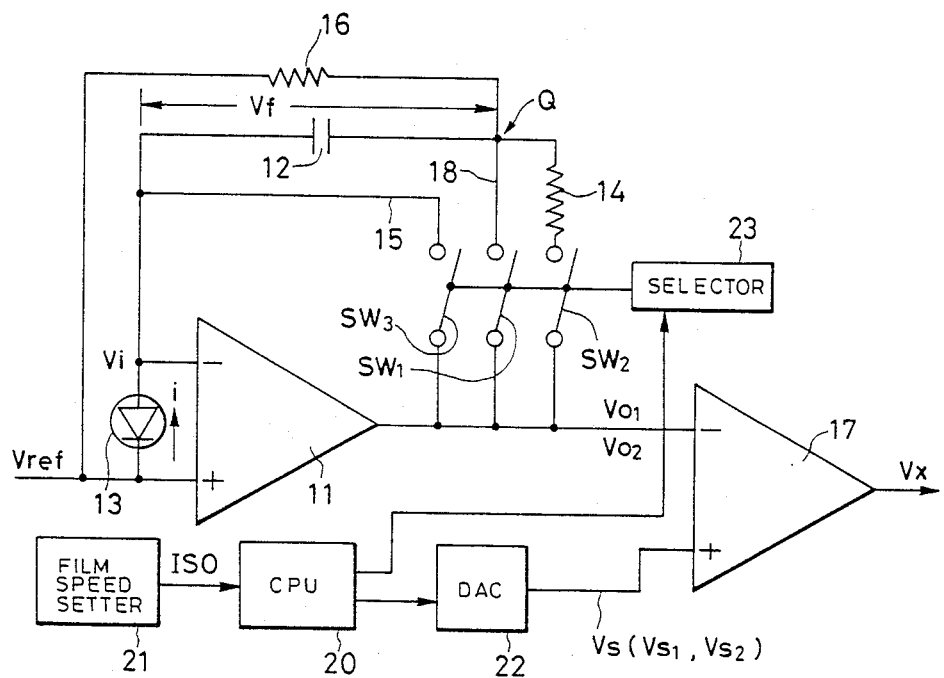
FIG. 2 is a circuit diagram showing a photoelectric amplifier which is one embodiment of this invention.

FIG. 2 is a circuit diagram showing a photometric amplifier according to the invention. In the photometric amplifier, an operational amplifier 11 and a capacitor 12 form an integrating circuit. The anode of a photodiode 13 is connected to the inverting input terminal input terminal of the operational amplifier 11 and the cathode is connected to the non-inverting input terminal. In the operational amplifier 11, a reference voltage $V_{ref}$ is applied to the non-inverting input terminal and an input voltage $V_i$ is applied to the inverting input terminal. That is, the operational amplifier 11 is an inverting amplifier.

One terminal of a capacitor 12 is connected to the inverting input terminal of the operational amplifier 11. Switches $SW_1$ and $SW_2$ provided between the capacitor 12 and the output terminal of the operational amplifier 11 form first and second circuit connecting means, respectively. When only the first switch $SW_1$ is closed, the capacitor 12 is connected directly to the output terminal of the operational amplifier 11. When only the second switch $SW_2$ is closed, the capacitor 12 is connected through a gain resistor 14 to the output terminal of the operational amplifier 11.

A third switch $SW_3$ forms a third circuit connecting means. When the third switch $SW_3$ is closed, the inverting input terminal of the operational amplifier 11 is connected through a conductor 15 to the output terminal. That is, the inverting input terminal is short-circuited with the output terminal, so that an input offset voltage is developed between the two input terminals.

A feedback resistor 16 is connected between the non-inverting input terminal of the operational amplifier 11 and the connecting point of the capacitor 12 and the first switch $SW_1$. The choice of resistances for the resistors 14 and 16 determines a gain factor and is made in light of the design of the integrated circuit.

Figure 1:
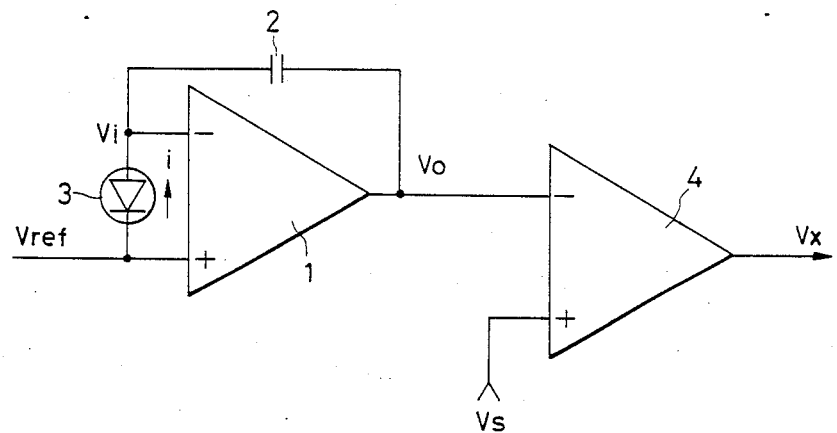
FIG. 1 is a circuit diagram showing one example of a conventional photometric amplifier.

A comparator 17 shown in FIG. 2 is a conventional one used similarly to the comparator 4 of FIG. 1. The above-described photometric amplifier output voltage is applied to one of the input terminals of the comparator 17, and the film reference voltage $V_S$ of the film sensitivity ISO is supplied to the other input terminal.

The exposure system of the camera is controlled by a microcomputer or CPU 20. The film speed or film sensitivity ISO is supplied by a film speed setting section 21, which may an automatic DX film speed reader which reads the film sensitivity ISO from the film canister. Based on the film sensitivity ISO, the CPU 20 outputs through a digital-to-analog converter 22 the reference voltage $V_S$ to the comparator 17. The CPU 20 also causes a selector 23 to close one of the switches $SW_1$, $SW_2$ or $SW_3$.

Now, the operation of the above-described photometric amplifier will be described.

Before a photometric operation is started, the third switch $SW_3$ (feedback short) is closed by the CPU 20 with the first and second switches $SW_1$ and $SW_2$ maintained open. As a result, an input offset voltage is developed between the two input terminals of the operational amplifier 11, to charge the capacitor 12. In this operation, the capacitor 12 is slightly charged, because the input offset voltage is of the order of several millivolts as is well-known in the art.

Under this condition, the first or second switch $SW_1$ or $SW_2$ through the capacitor 12 is closed by the CPU 20 according to the film sensitivity ISO to start the photometric operation. It should be noted that, in the operation, the third switch $SW_3$ is held open. For instance when the first switch $SW_1$ is closed, the gain A of the operational amplifier 11 becomes one (1). Then, the integration voltage $V_f$ of the capacitor 12, which is charged by the photocurrent i, is provided as an output voltage $V_{01}$ as is apparent from the following equation $$V_{01} = V_f r_1/r_1 = V_f$$

where $r_1$ is the resistance of the feedback resistor 16.

When, instead of the first switch $SW_1$, the second switch $SW_2$ is closed, the capacitor 12 is connected through the gain resistor 14 to the output terminal of the amplifier 11. Thus, an output voltage $V_{02}$ represented by the following equation is provided:

$$V_{02} = V_f(r_1+r_2)/r_1;$$

i.e., $V_{02} = AV_f = AV_{01}$ where $r_2$ is the resistance of the gain switching resistor 14, and $A = (r_1+r_2)/r_1$.

As is clear from the above-described equation, the output voltage $V_{02}$ provided when the second switch $SW_2$ is closed is A times that voltage $V_{01}$ provided with the first switch $SW_1$ is closed.

Figure 3:
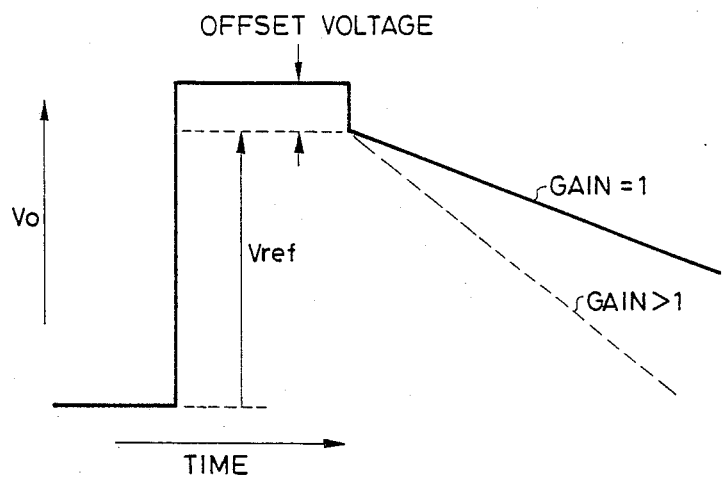
FIGS. 3 and 4 are waveform diagrams of the output of the photoelectric amplifier.

FIG. 3 is a waveform diagram for the output voltage $V_0$ of the operational amplifier 11 as a function of time. When the power is turned on, only the third switch $SW_3$ is closed. The output voltage $V_0$ is kept near the reference voltage $V_{ref}$ but is displaced by the offset voltage at the inputs to the operational amplifier 11. Thereafter, the third switch $SW_3$ is opened and, either the first switch $SW_1$ (gain=1) or the second switch $SW_2$ is closed so that the photocharge of the photodiode 13 is integrated.

Figure 4:
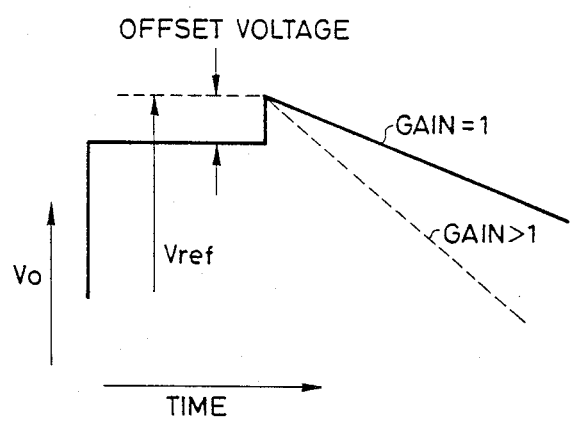

FIG. 4 is similar to FIG. 3 except that it shows an offset voltage that is negative rather than positive with respect to the reference voltage $V_{ref}$.

The output voltage $V_{01}$ or $V_{02}$ is applied, as photometric data, to the comparator 17, where it is compared with the film reference voltage $V_S$ of the film sensitivity ISO. When $V_{01} = V_{S1}$, or $V_{02} = V_{S2}$, a binary state operation voltage $V_X$ is output by the comparator 17. In this condition, $V_{S1}$ is the film reference voltage applied to the other input terminal of the comparator 17 when the output voltage $V_{01}$ is supplied to the one terminal of the comparator and $V_{S2}$ is the film reference voltage applied to the other input terminal of the comparator 17 when the output voltage $V_{02}$ is supplied to the one input terminal of the comparator. More specifically, $V_{S1}$ is equal to $V_S$ ($V_{S1} = V_S$), and $V_{S2}$ is obtained by increasing $V_S$ by a factor A according to the gain ($V_{S2} = A V_S$).

Accordingly, in the case where it is required to set a high film sensitivity ISO, the second switch $SW_2$ is closed by the CPU 20 so that the output voltage $V_{02}$ is supplied, as photometric data, to the comparator 17. That is, the film reference voltage $V_{S2}$ which is a relatively high value can be applied to the comparator 17.

The following Table 2 indicates output voltages $V_{01}$ with film reference voltages $V_{S1}$ with the first switch $S_{W1}$ closed, and output voltage $V_{02}$ with film reference voltages $V_{S2}$ with the second switch $S_{W2}$ closed so that the gain is set to eight (8).

TABLE 2

| $V_f$ | $V_{O1}$ | ISO | $V_{S1}$ |
|---|---|---|---|
| | ($V_{O1}$, $V_{O2}$, $V_{S1}$ and $V_{S2}$: in millivolts) | | |
| | $SW_1$: closed A = 1 | | |
| 40 | 40 × 1 | 50 | 40 × 1 |
| 20 | 20 × 1 | 100 | 20 × 1 |
| 10 | 10 × 1 | 200 | 10 × 1 |
| | $SW_2$: closed A = 8 | | |
| 5 | 5 × 8 | 400 | (5 × 8) 40 |
| 2.5 | 2.5 × 8 | 1800 | (2.5 × 8) 20 |
| 1.25 | 1.25 × 8 | 1600 | (1.25 × 8) 10 |

As is apparent from Table 2 above, when film ISO sensitivities ranging from 50 to 1600 are set by the film speed setter 21, three film reference voltages $V_{S1}$ and three film voltages $V_{S2}$ are used, which are 10 mV, 20 mV and 40 mV in common. Thus, the range of film reference voltages is reduced to half even on a logarithmic scale.

In the above-described embodiment, only one gain switching resistor 14 is employed. However, the circuit may be so modified that a plurality of gain switching resistors of different resistance are arranged in parallel, and are selectively connected to the output terminal of the operational amplifier. In this modification, the gain can be changed to $A_1$, $A_2$, $A_3$ and so on, and therefore, when the resolution voltages are determined in the same manner as in the above-described embodiment, the resolution voltages are further decreased in number and in range. For instance when two gain switching resistors are used, only two film reference voltages (for instance 30 mV and 40 mV) are used for film speeds ISO ranging from 50 to 1600.

The switches $SW_1$, $SW_2$ and $SW_3$ may be semiconductor switches which are selectively operated by control signals provided according to a microcomputer program associated with the CPU 20. Furthermore the switches $SW_1$ and $SW_2$ may be replaced by a switch whose armature is tripped selectively to the connecting line 18 and the gain changing resistor 14.

In the photometric amplifier according to the first aspect of the invention, the output voltage (photometric data) can be increased to several times the integration voltage of the integrating capacitor by changing the gain with the circuit connecting means.

Therefore, if, in setting a high film sensitivity ISO, the gain is changed as described above, then the output voltage can be compared with the resolving voltage which is the product of the resultant gain and the original resolution voltage corresponding to the high film sensitivity.

If the gain of the photometric amplifier is changed to a value A, then the output voltage $V_0$ is increased to A times the capacitor's integration voltage $V_f$, that is, $V_0 = A V_f$.

In the case where a film sensitivity ISO of 1600 is set, the original reference voltage $V_S$ is 1.5 mV in the conventional photometric amplifier. However, according to the invention, the film reference voltages $V_S$ is increased to $A \times 1.5$ mV, because the film reference voltage should be increased by a factor A according to the change of the gain of the photometric amplifier as was described above.

In other words, both the integration voltage $V_f$ of the integrating capacitor and the reference voltage $V_S$ are multiplied by the factor A so that the photometric data and the film sensitivity data can be compared.

As is apparent from the above description, it is unnecessary for the photometric amplifier of the invention to handle a small film reference voltage, for instance 1.5 mV, in setting a high film sensitivity ISO. Therefore, the photometric amplifier can be effectively applied to an electronic shutter camera with a microcomputer.

The photometric amplifier according to the second aspect of the invention includes the circuit connecting means for causing, before a photometric operation, the integrating capacitor to absorb the input offset voltage developed when the operating amplifier is employed as an integrating circuit. Therefore, in the photometric amplifier, the photometric data can be operated with the exposure factor with the inclusion of the input offset voltage in the photometric data known in advance. Thus, the photometric error due to the input offset voltage can be eliminated.

As was described above, the photometric amplifier according to the invention is so designed that the gain is changed in correlation with an exposure factor other than an object luminance. Therefore, in the operation of the output photometric data with an exposure factor such as for instance a film sensitivity ISO, the film reference voltages can be reduced in number and in range and can be set to suitable values.

Accordingly, when the photometric amplifier according to the invention is employed for a camera in which the exposure control is carried out by a microcomputer, then it will greatly contribute to simplification of the electrical arrangement of the camera.

What is claimed is:
1. A photoelectric amplifier comprising:
   a photosensitive element;
   an operational amplifier receiving an output of said photosensitive element;
   integrating means having a first terminal connected to said photosensitive element and being charged by said photosensitive element;
   a first electrical path connecting a second terminal of said integrating means to a non-inverting input terminal of said operational amplifier through a first resistance;
   an actuable second electrical path connecting an output terminal of said operational amplifier to said second terminal of said integrating means;
   an actuable third electrical path connecting said output terminal of said operational amplifier to an inverting input terminal of said operational amplifier;
   selecting means for selectively actuating said second and third paths, an integration voltage based on an input offset voltage of said operational amplifier being stored in said integrating means as an output of said operational amplifier when said third path is actuated.

2. A photoelectric amplifier of claim 1, further comprising:
at least one fourth electrical path connecting said second terminal of said integrating means to said output terminal of said operational amplifier and having a resistance wherein said selecting means actuates one of said second, third and fourth switch a gain of said operational amplifier with said first resistance.

3. A photoelectric amplifier of claim 2, wherein said selecting means selects one of said second path and said fourth path in response to a film sensitivity value.

4. A photoelectric amplifier of claim 3, further comprising a comparator receiving an output of said operational amplifier and a reference voltage provided by said selecting means in response to said film sensitivity value.

5. A photoelectric amplifier of claim 1, wherein said operational amplifier comprises field effect transistors.

* * * * *